(12) United States Patent
Fink

(10) Patent No.: US 7,350,476 B2
(45) Date of Patent: Apr. 1, 2008

(54) METHOD AND APPARATUS TO DETERMINE CONSUMABLE PART CONDITION

(75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 387 days.

(21) Appl. No.: 11/018,253

(22) Filed: Dec. 22, 2004

(65) Prior Publication Data
US 2006/0130970 A1  Jun. 22, 2006

(51) Int. Cl.
G01D 21/00 (2006.01)
G01N 21/00 (2006.01)
C23C 16/00 (2006.01)
C23C 16/52 (2006.01)
H01L 21/306 (2006.01)

(52) U.S. Cl. .............. 116/201; 116/200; 116/208; 356/72; 156/345.24; 118/715; 118/712; 118/713

(58) Field of Classification Search .......... 118/715, 118/723 R, 712, 713; 156/345.24, 345.25, 156/345.28; 116/200, 201, 206, 208; 356/72, 356/316, 282
See application file for complete search history.

(56) References Cited

U.S. PATENT DOCUMENTS

| 3,662,863 | A | * | 5/1972 | Dombeck | 188/1.11 R |
| 5,228,478 | A | * | 7/1993 | Kleisle | 138/104 |
| 6,394,023 | B1 | | 5/2002 | Crocker | 116/208 |
| 7,147,793 | B2 | * | 12/2006 | Fink | 216/71 |
| 2004/0157445 | A1 | * | 8/2004 | Fink | 438/689 |
| 2005/0041238 | A1 | * | 2/2005 | Ludviksson et al. | 356/72 |
| 2006/0130970 | A1 | * | 6/2006 | Fink | 156/345.24 |

FOREIGN PATENT DOCUMENTS

WO   WO 02/101116 A1 * 12/2002

* cited by examiner

Primary Examiner—Jeffrie R Lund
(74) Attorney, Agent, or Firm—Oblon, Spivak, McClelland, Maier & Neustadt, P.C.

(57) ABSTRACT

A system for monitoring a condition of a consumable component in a substrate processing system that includes a tapered plug having a first axis, a second axis that intersects the first axis, a top portion with first width, a bottom portion with a second width, and sidewalls joining said top and bottom portions respectively. The tapered plug has a cross sectional profile that is substantially parallel to the top and bottom portions and a cross sectional width that varies according to a location where the cross sectional profile intersects the second axis. At least one of the tapered plugs is inserted into at least one consumable component of the substrate processing system such that the top portion of the tapered plug is exposed to a processing environment of a plasma processing system.

18 Claims, 12 Drawing Sheets

METHOD AND APPARATUS TO DETERMINE CONSUMABLE PART CONDITION

FIELD OF THE INVENTION

The present invention generally relates to an apparatus and method for determining critical dimensions and/or tolerances of consumable components located within a plasma processing system using a tapered plug configured to be inserted into or placed near the consumable components of the plasma processing system.

BACKGROUND OF THE INVENTION

The fabrication of integrated circuits (IC) in the semiconductor industry typically employs plasma to create and assist surface chemistry within a plasma reactor necessary to remove material from and deposit material to a substrate. Plasma can be formed in numerous sources, including a capacitively coupled plasma (CCP) source, an inductively coupled plasma (ICP) source, an electrostatic radio frequency (ESRF) source, or any combination thereof.

In general, plasma is typically formed under vacuum conditions by heating electrons to energies sufficient to sustain ionizing collisions with a supplied process gas. Moreover, the heated electrons can have energy sufficient to sustain dissociative collisions, and therefore, a specific set of gasses under predetermined conditions (e.g. chamber pressure, gas flow rate, etc.) are chosen to produce a population of charged species and chemically reactive species suitable to the particular process being performed within the chamber (e.g. etching processes where materials are removed from the substrate or deposition where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the plasma processing chamber are exposed to the physically and chemically active plasma, and in time, can erode or become coated with deposits. The erosion or coating of exposed components in the plasma processing system can lead to a gradual degradation of the plasma processing performance and ultimately to complete failure of the system. Thus, various parts of a plasma processing system consist of consumable or replaceable components that are fabricated from silicon, quartz, alumina, carbon, or silicon carbide, for example and placed in the processing system to protect more critical components. Examples of consumable system components include electrodes, shields, rings, baffles and liners.

The consumable nature of these components requires that they be periodically cleaned or replaced. However, consumable components are commonly replaced or cleaned only after detrimental processing conditions or process results are observed. The adverse processing conditions can include plasma arcing, particle formation, variations in substrate etch rate, etch selectivity and etch uniformity. Alternatively, consumable components may be replaced or cleaned according to a predetermined maintenance schedule that can, for example, be based on the number of plasma operating hours. However, these methods can result in overdue or premature replacement or cleaning of consumable system components. In view of these inaccuracies, consumable components are frequently inspected, not only to ensure compliance with strict tolerances, but to avoid premature cleaning and replacement of the consumable components.

Conventionally, measurement metrology techniques, such as measuring the consumable component with precision calipers or some other general purpose measuring tool are utilized. However, such techniques typically require stopping the chamber process to gain internal access, and possibly disconnecting and removing the consumable component from their plasma chambers, which can be labor intensive and result in expensive down-time for personnel and plasma processing tools. Moreover, the use of general purpose measuring tools to test a consumable component requires accurate reading of the tool as well as knowledge of the desired dimension for the particular consumable component being measured. These requirements can lead to false indications of the status of the consumable component.

One alternative method of determining the status of a part is by manufacturing the consumable component with a mark such as an etch or scribe mark, the visibility of which aids in determining whether a consumable component is within tolerance. For example, a mark may be formed by scribing a symbol to a particular scribe depth in the part. When the part is subject to processing and cleaning, one can determine whether the part has eroded beyond the scribe depth by simply verifying whether the symbol is visible or not. While this method can allow inspection of the consumable component condition without compromising the process vacuum, this method requires a specially manufactured part having the scribe depth formed therein. Moreover, a consumable component may have different tolerances for different processes performed in the chamber. Therefore, the depth of the scribe mark must be specifically calculated to consider both the consumable component and the chamber processes that the consumable component will be exposed to during use may result in an otherwise generic process part becoming process specific. Still further, consumable components have been equipped with a cavity formed at a certain depth in the consumable component and configured to emit light when exposed to a process environment of the processing system. Thus, when the consumable component is eroded enough, the emitter can emit light to indicate that the consumable component should be replaced. However, these consumable components also typically require specific manufacturing and/or can render a generic part process specific as described above. Moreover, these parts require sophisticated and expensive optical emission spectroscopy systems.

SUMMARY OF THE INVENTION

Accordingly one object of the present invention is to address the above described and/or other problems with consumable components.

Another object of the present invention is to allow determining a consumable component condition without stopping a chamber process.

Still another object of the invention is to facilitate the retrofitting of a consumable component providing the ability to determine a consumable component condition.

Yet another object of the invention is to allow determining a consumable component condition without the use of optical emission spectroscopy.

These and/or other objects of the invention may be provided by a part for monitoring a condition of a consumable component used in a substrate processing system, including a tapered plug having a first axis, a second axis intersecting said first axis, a top portion having a first width along the first axis, a bottom portion having a second width along the first axis, at least one sidewall joining top and bottom portions, respectively, and a cross sectional profile that is substantially parallel to the top bottom portions and has a cross sectional width that varies according to the location where the cross sectional profile intersects the second axis. The tapered plug is configured to be inserted into a consumable component such that the top portion is exposed to the processing environment of the plasma processing system.

It is to be understood that both the foregoing general description of the invention and the following detailed description are exemplary, but are not restrictive, of the invention.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF THE INVENTION

Figure 1:
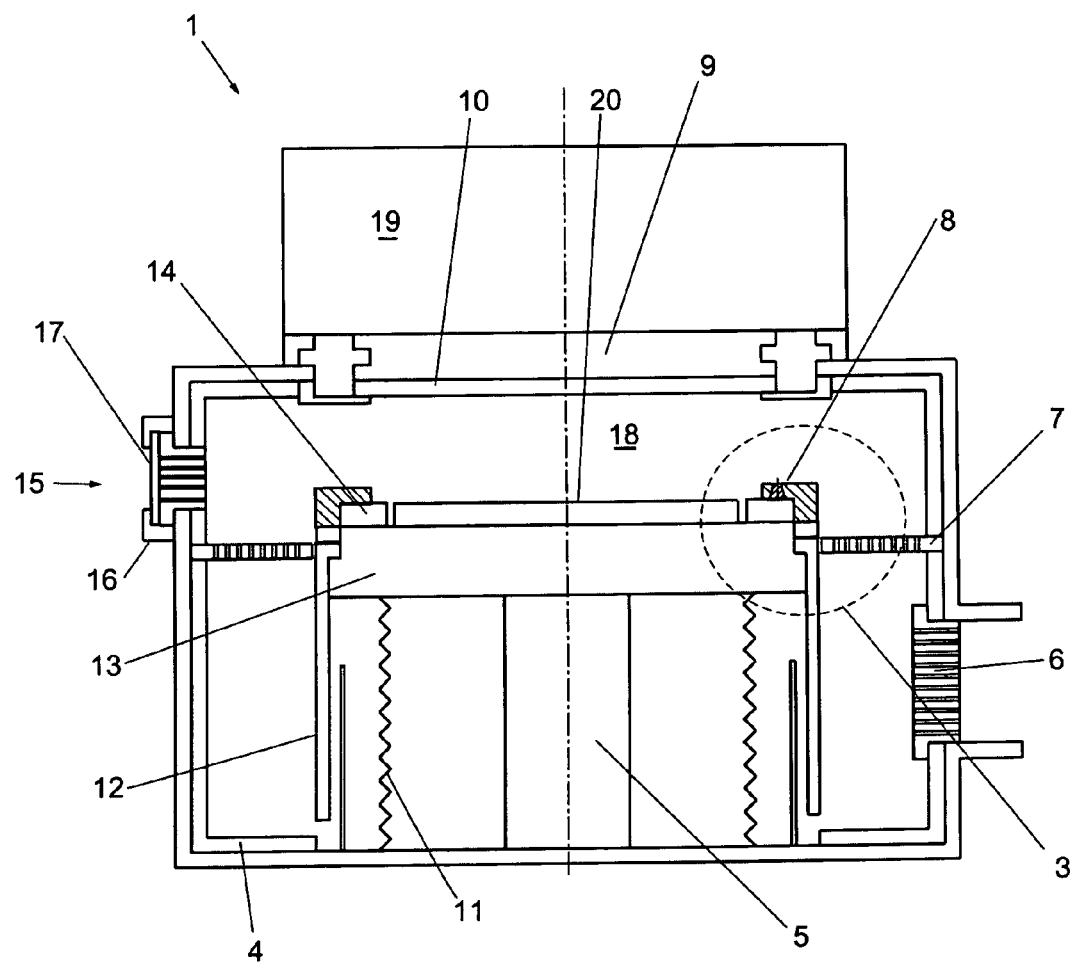
FIG. 1 illustrates the usual major components of a Capacitively Coupled Plasma (CCP) source as a generic example of a plasma processing system.

Referring now to the drawings, wherein like reference numerals designate identical or corresponding parts throughout the several views, FIG. 1 is a simplified block diagram of the plasma processing system. More specifically, FIG. 1 illustrates the present invention in relation to the usual components of a capacitively coupled plasma (CCP) source as a non-limiting example of a plasma processing system. The CCP 1 depicted in FIG. 1 comprises a plasma process chamber 4, an upper electrode assembly 9, an electrode plate 10, a substrate 20, a substrate holder 13 for supporting the substrate 20, and a pumping port 6 configured to be coupled to a vacuum pump (not shown) for providing an appropriate pressure atmosphere in the plasma processing chamber 4. Plasma process chamber 4 can facilitate the formation of a processing plasma in a process space 18 adjacent to substrate 20. The CCP 1 can be configured to process various substrates, which can vary in size, shape, and material composition, for example.

A gas injection assembly 19 can introduce process gas to the process chamber 4. The gas injection system 19 can include a shower head (not shown), wherein the process gas is supplied from a gas delivery system (not shown) to the process space 18 through a gas injection plenum (not shown), a series of baffle plates (not shown) and a multi-orifice shower head gas injection plate (not shown).

Plasma process chamber 4 can, for example, further comprise an optical viewpoint 15 that includes an optical window 17 and optical window flange 16. Sealing members, such as O-rings, can be provided between the optical window flange 16 and the optical window 17. Further, an optical monitoring system (not shown) can provide viewing of the substrate 20 and various other components included in the process chamber 4.

Substrate holder 13 can, for example, include a chuck assembly 5 for vertical translation of the substrate 20. Further, the chuck assembly 5 may be surrounded by bellows 11 coupled to the substrate holder 13 and the base of the plasma process chamber 4. Additionally, a bellows shield 12 can, for example, be coupled to the substrate holder 13 and configured to protect the bellows 11 from the processing plasma. Substrate holder 13 can, for example, further be coupled to at least one focus ring 14 and at least one shield ring 8. Furthermore, a pumping baffle 7 can extend about a periphery of the substrate holder 13.

A substrate 20 can be transferred into and out of plasma process chamber 4 through a slot valve (not shown) and a chamber feed-through (not shown) via a robotic substrate transfer system where it is received by substrate lift pins (not shown) housed within a substrate holder and mechanically translated by devices housed therein. Once substrate 20 is received from the substrate transfer system, it is lowered to an upper surface of the substrate holder 13.

The substrate 20 can be affixed to the substrate holder 13 via an electrostatic clamping system. Furthermore, substrate holder 13 can, for example, include a cooling system including a re-circulating coolant flow that receives heat from the substrate holder 13 and transfers heat to a heat exchanger system (not shown), or when heating, transfers heat from the heat exchanger system. Moreover, gas can, for example, be delivered to the back side of a substrate 20 via a back side gas system (not shown) to improve the gas-gap thermal conductance between the substrate 20 and the substrate holder 13. Such a system can be utilized when temperature control of the substrate is required at elevated or reduced temperatures. In other embodiments, heating elements, such as resistive heating elements, or thermoelectric heaters/coolers can be included. A controller (not shown) including a microprocessor, a memory, and a digital input/output port capable of generating control voltages sufficient to communicate and activate inputs to the CCP 1 as well as monitor outputs from the CCP 1 could be used to control the CCP 1. One example of such a controller is DELL PRECISION WORKSTATION 610™, available from Dell Corporation, Dallas, Tex.

As shown in FIG. 1, the CCP includes a variety of consumable components, including but not limited to, at least one focus ring 14, at least one shield ring 8, an electrode plate 10 and at least one bellows shield 12. These exemplary system components are consumable components, that during plasma processing, commonly become coated, eroded, or both, and therefore can be monitored to facilitate proper replacing and/or cleaning.

One example of a consumable component illustrated in FIG. 1 is the focus ring 14. Focus ring 14 encircles the substrate 20 to control the edge properties in process space 18 above the substrate 20. The status (extent of erosion or material deposition) of the focus ring 14 is commonly determined ex situ by removing the focus ring from the CCP 1 and measuring the reduction or increase in the thickness of the focus ring 14. Alternatively, the status of the focus ring can be evaluated by visual inspection. A change on the order of a few tenths of a millimeter in the thickness of the focus ring 14, can require replacement of the focus ring 14. A non-exhaustive list of consumable components included in plasma processing systems includes electrodes, shields, rings, baffles, and liners. As noted above, consumable components may be fabricated from silicon, quartz, alumina, carbon, or silicon carbide.

Figure 2:
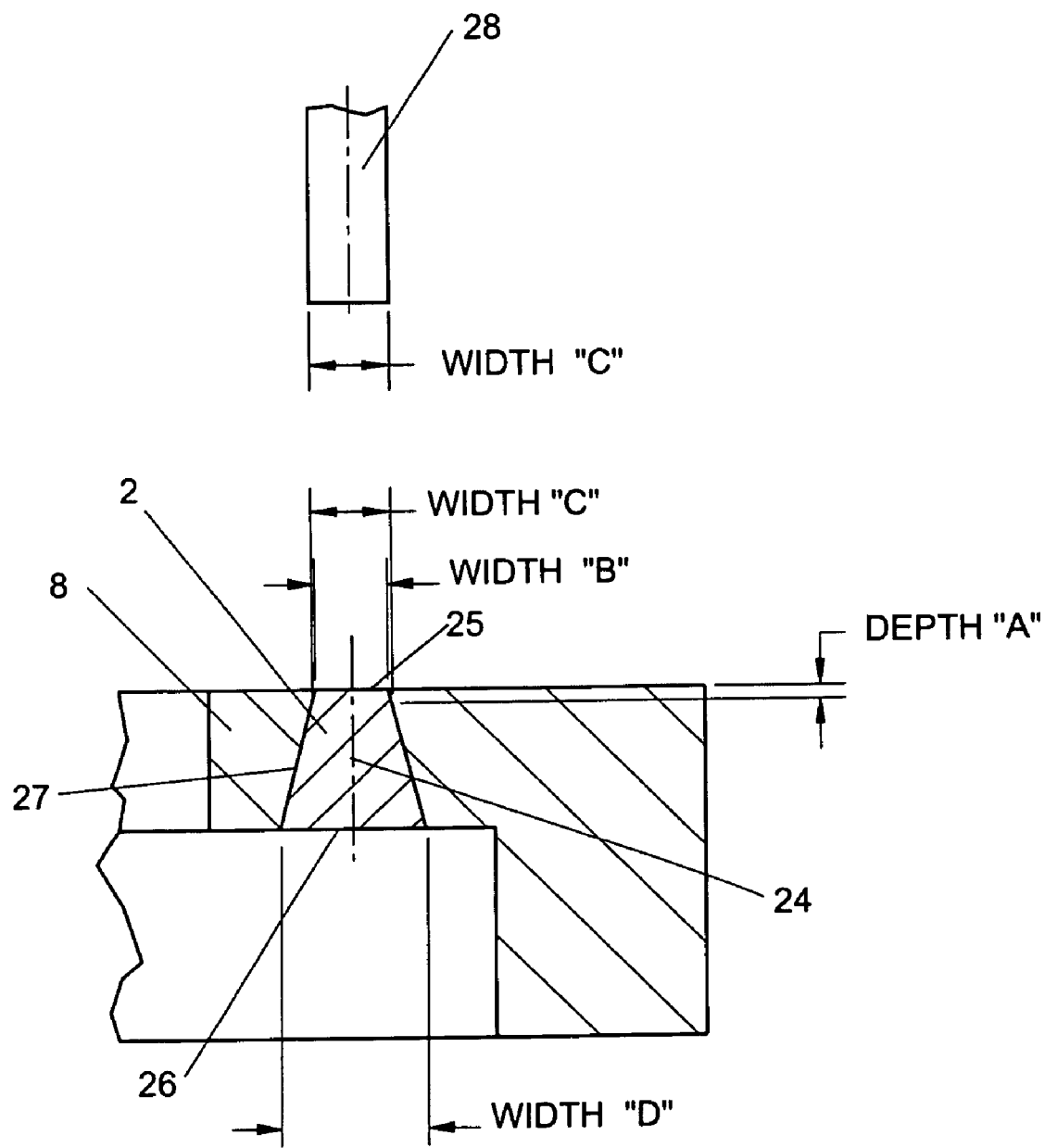
FIG. 2 illustrates a tapered plug according to the first exemplary embodiment of the present invention inserted into a consumable component of a plasma processing system.
Figure 3:
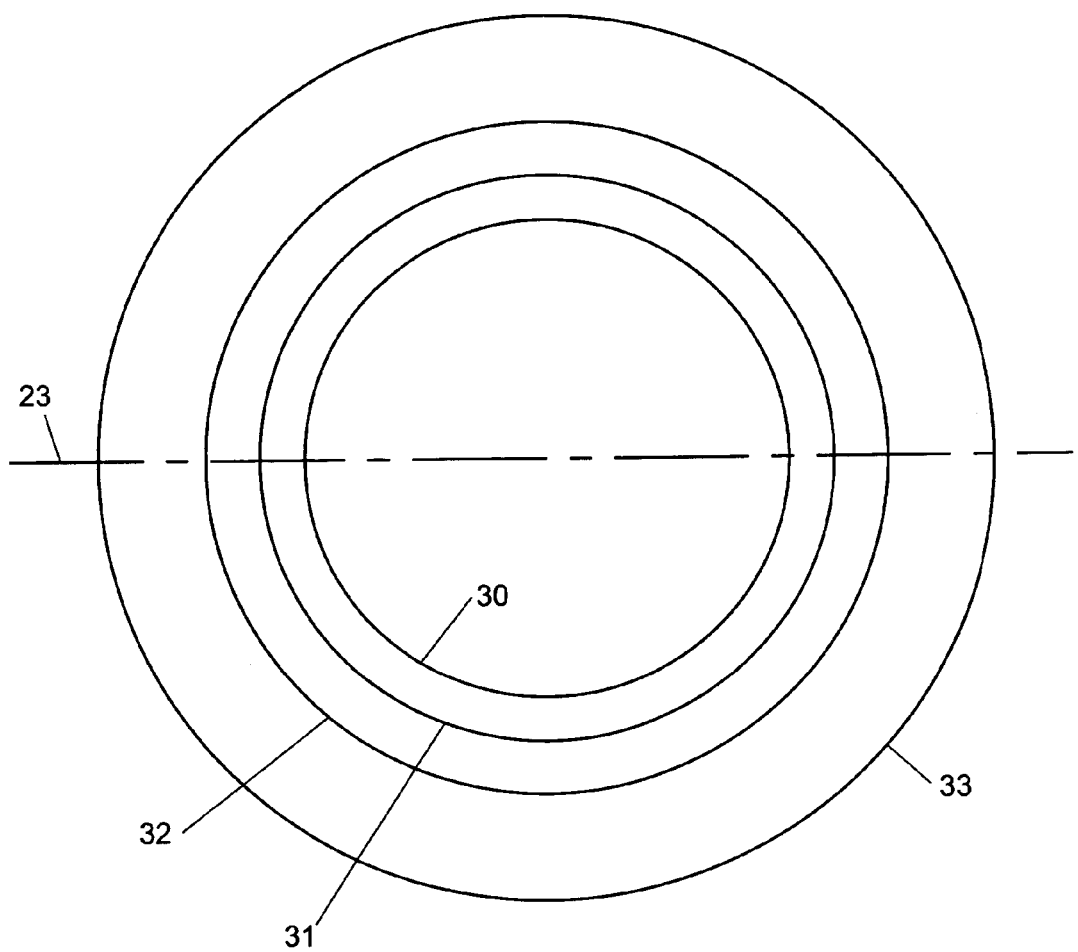
FIG. 3 is a planar view from a perspective above the tapered plug of the first exemplary embodiment inserted into a consumable component illustrated in FIG. 2.

The circled area 3 in FIG. 1, illustrates a non-limiting example of a consumable component (shield ring 8) with a tapered plug 2 inserted into the consumable component and used to monitor the condition of the consumable component. A first exemplary embodiment of a tapered plug is illustrated in FIGS. 2 and 3. As seen in these figures, the tapered plug 2 of the first embodiment has a first axis 23 and a second axis 24 orthogonal to first axis 23. Top potion 25 and bottom portion 26 are located on opposite ends of the plug and joined by sidewalls 27 along the direction of axis 24. The top portion 25 has a first width B along axis 23, while bottom portion 26 has a second width D along the first axis 23. As shown in the exemplary embodiment of FIG. 2, initially, the width of the top portion 25 of the tapered plug 2 is width B, whereas after tapered plug erodes and the top portion 25 of the tapered plug 2 is located at a depth A, the width of the top portion 25 of the tapered plug 2 becomes width C. In other words, as tapered plug 2 erodes due to exposure to the processing environment the width of the top portion 25 of the tapered plug increases in the embodiment of FIG. 2.

FIG. 3 is a planar view from a perspective above the tapered plug 2 illustrated in FIG. 2. FIG. 3 illustrates the variation in the width of the cross-sectional profile of the tapered plug at different locations along the second axis 24. Line 30 illustrates the width of the cross sectional profile of the tapered plug 2 before erosion or degradation (i.e. a width of the top portion). Line 31 illustrates the width of the cross sectional profile of the tapered plug 2 at a depth A. Line 32 illustrates the width of the cross sectional profile of the tapered plug at a critical depth that is determined by the user and will be discussed in greater detail later with regard to FIG. 12. Lastly, line 33 illustrates the width of the cross sectional profile of the bottom portion 26 of the tapered plug 2. As shown in FIG. 3, the width of a cross sectional profile that is substantially parallel to the top portion 25 and bottom portion 26 varies according to the location where the cross sectional profile intersects the second axis 24 of the tapered plug 2.

Figure 4:
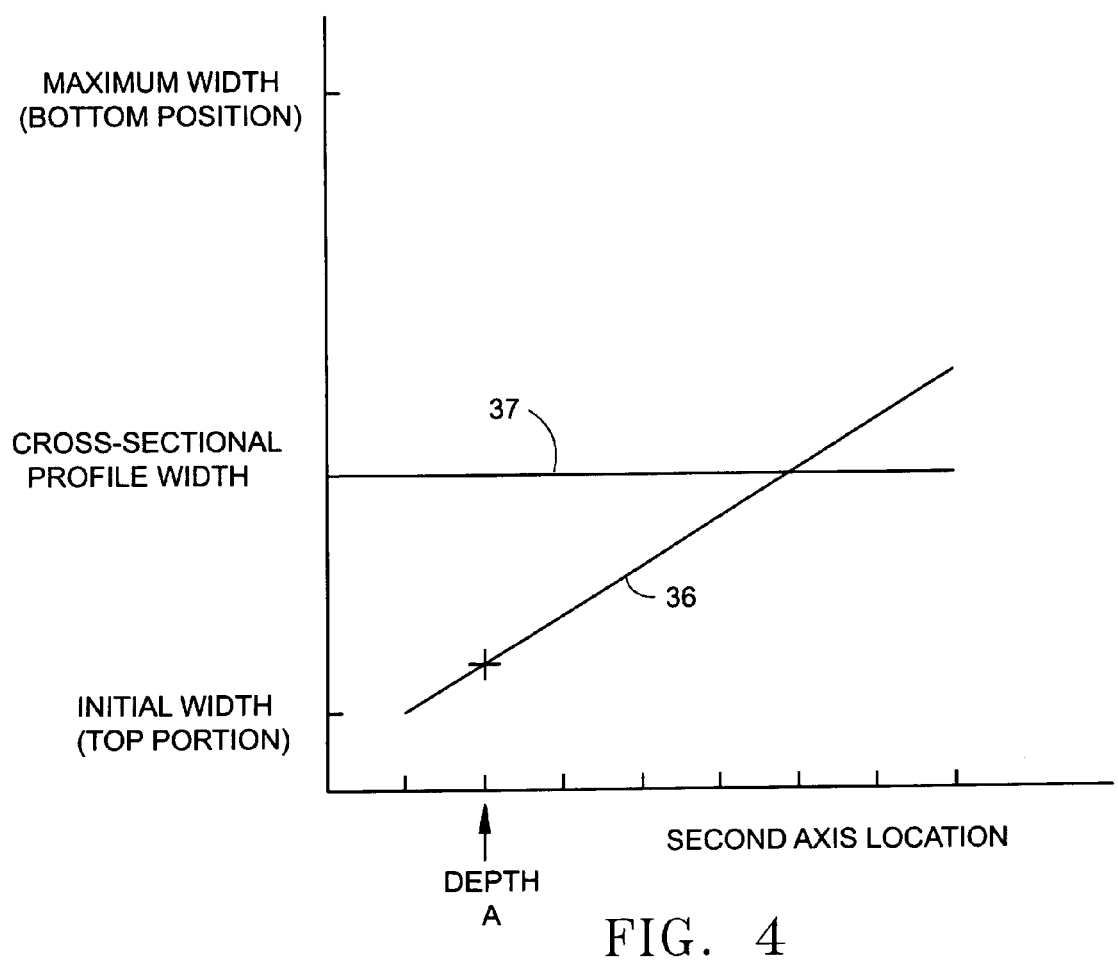
FIG. 4 is a graph illustrating the change in the width of the top portion of the tapered plug of the first exemplary embodiment as the tapered plug erodes or degrades due to exposure to the processing environment.

FIG. 4 is a graph illustrating the change in the width of the top portion 25 (i.e. a cross sectional profile) of the tapered plug 2 as the tapered plug erodes or degrades due to exposure to the processing environment. In FIG. 4, the abscissa represents locations along the axis 24 of the tapered plug, while the ordinate represents the width of the cross sectional profile ranging from the initial width of the top portion 25 of the tapered plug 2 before erosion or degradation to a maximum width which is equal to the width of the bottom portion 26 of the tapered plug 2. Line 36 on the graph represents the width of the top portion 25 of the tapered plug 2 as the plug erodes due to exposure to the processing environment. While the line 36 has an arbitrary slope, in a preferred embodiment, the tapered plug is designed such that the line 36 approaches horizontal to the greatest extent practical. Having such a steep taper allows a very small erosion depth to result in a large change in diameter that can be easily noticed.

Horizontal line 37 represents a critical width of the cross sectional profile of the tapered plug 2 that is indicative of when the consumable component in which tapered plug 2 is inserted into or placed in close proximity should be replaced. Thus, in this first exemplary embodiment once the width of the top portion 25 of the tapered plug 2 is equal to or larger than the critical width, service action is required by the user (i.e. the consumable component should be replaced, cleaned, or the continued erosion of the consumable component should be more closely monitored). The critical width is a width set by the user and will be discussed in detail later with regard to FIG. 12.

As described above, consumable components of the CCP 1 may be fabricated from silicon, quartz, alumina, carbon, or silicon carbide. Similarly, the tapered plug 2 can be fabricated from, but is not limited to, materials such as silicon, quartz, alumina, carbon, or silicon carbide. Normally, the tapered plug is the same material or combination of materials as the consumable component that the tapered plug is associated with except having a different grain, shade or other feature that allows the plug to be distinguished from the consumable component itself.

A variety of metrology techniques can be used to obtain the width of the top portion 25 of the tapered plug 2. For example, as illustrated in FIG. 2 a gauge pin 28 or similar device can be used to measure the width of the top portion 25 of the tapered plug 2. More specifically, gauge pin 28 with a width C could be placed directly above top portion 25 of the tapered plug 2. As long as the gauge pin 28 can cover the tapered plug, the shield ring 8 is within tolerances and is acceptable for plasma processing operations. As shown in FIG. 2, the initial width of the top portion 25 of tapered plug 2 is width B. As both the shield ring 8 and tapered plug 2 erode the width of the top portion 25 of the tapered plug 2 increases until it is the same size, or larger, than the gauge pin 28. Thus, the condition of the consumable component can be measured with a simple tool that does not require removal of the consumable component. Measurements for determining the condition of a consumable component as the one described above can be made to the consumable component while installed in the plasma processing system or outside the plasma processing system in the clean room.

While the hand tool measurement technique may require stopping the process to gain access to the chamber, this is not required by the present invention. Specifically, by providing a visual path to the top side of the tapered plug, one can determine a condition of the consumable component without breaking the process vacuum, and during processing or dry cleaning events for example. In this regard, the visual path may be as simple as a viewing window or as complex as an optical viewing device used to take actual measurements of the top portion of the tapered plug.

Finally, unlike the scribe method or emitter methods discussed above, the tapered plug of the present invention can be easily retrofitted into an existing consumable component, and does not render the consumable component process specific. That is, the tapered plug can erode in the same general way for each process, and only the diameter or width size indicating time for replacement or cleaning is unique to the process performed. Still further, unlike the emitter method, the tapered plug does not require complex and expensive metrology tools such as OES equipment.

In the first exemplary embodiment as described above and illustrated in FIGS. 1-4, the tapered plug is a tapered plug with a circular cross sectional shape. However, it should be noted that various cross sectional shapes of tapered plugs may be used. Further, while the exemplary embodiments in FIGS. 1-17 illustrate only a single tapered plug inserted into a shield ring 8, numerous tapered plugs may be inserted into a single consumable component. This is useful since erosion can occur at different rates in different areas on any one consumable component. Further, the variety of consumable components includes, but is not limited to, electrodes, shields, rings, baffles, and liners.

As noted above, using a tapered plug that is configured to be inserted into a consumable component for determining particular feature sizes and/or tolerances of the consumable component as described above can provide the ability to quickly determine the condition of a consumable component without the use of time-consuming metrology techniques that may require the consumable component to be removed from the plasma processing system. Therefore, the cost of disassembly and subsequent reassembly of the plasma processing system which results in down-time can be avoided. Further, the measurement of the tapered plug can be made in the clean room environment (or anywhere else) without removal to a metrology environment. Finally, the same tapered plug, or measurement assembly can be used in multiple consumable components (i.e. different consumable components in the same system or different consumable components in different systems).

Figure 5:
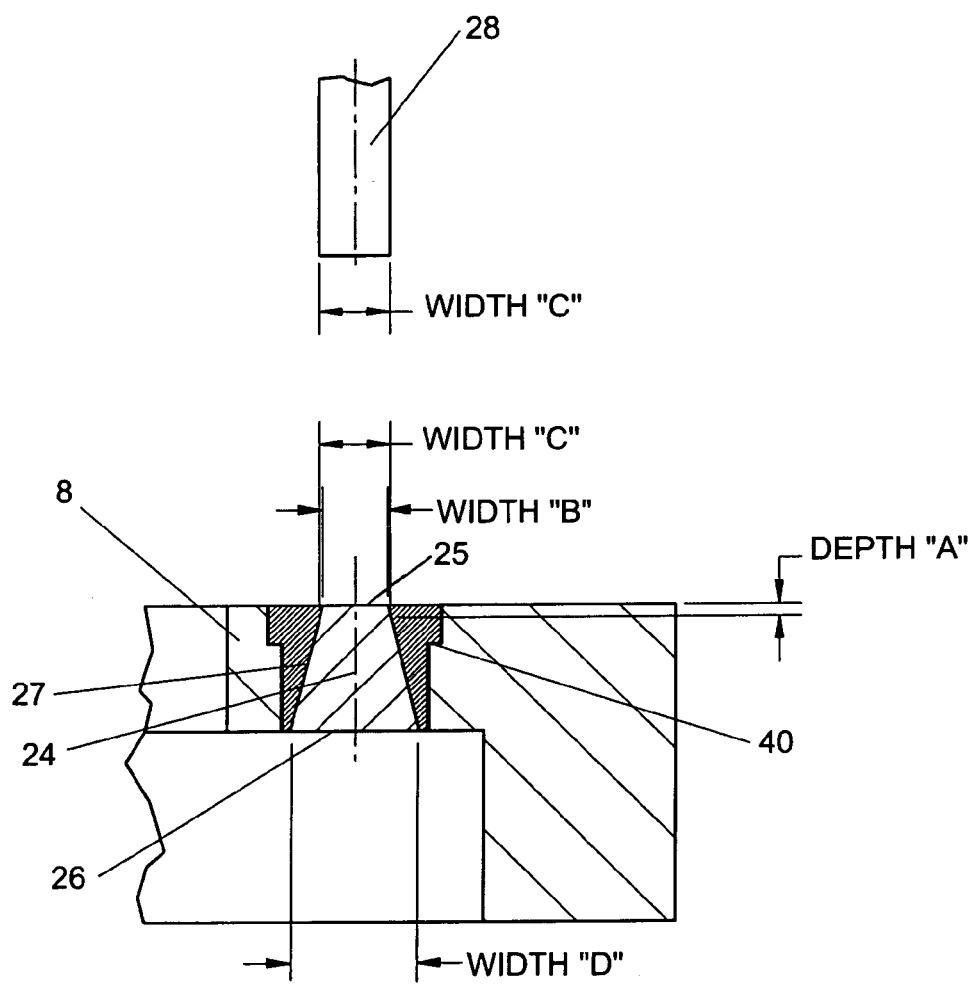
FIG. 5 illustrates the second exemplary embodiment of the present invention which includes an adapter that at least in part surrounds the tapered plug and is inserted into a consumable component of a plasma processing system.

A second exemplary embodiment is illustrated in FIG. 5 and includes the same features as the first exemplary embodiment explained above and illustrated in FIGS. 1-4 with the addition of an adapter 40. Since many of the features of the secondary exemplary embodiment were discussed previously with respect to the first exemplary embodiment, the detailed description of these features will not be reiterated in the discussion of the second exemplary embodiment.

As shown in FIG. 5, the tapered plug 2 is at least surrounded in part by an adapter 40. The adapter 40 allows the insertion of the tapered plug 2 from the top side of the shield ring. The adapter 40 can be made of the same material as the consumable component, tapered plug, or of a different material depending on the user's requirements. Further, the measurement logic involving the first width of top portion 25 of the tapered plug 2 are similar to the measurement logic used above with respect to the first exemplary embodiment. The adapter 40, as shown in FIG. 5, facilitates retrofitting the tapered plug 2 into standard consumable components of the plasma processing system because a counter bore is easier to make with precision than a tapered hole.

Figure 6:
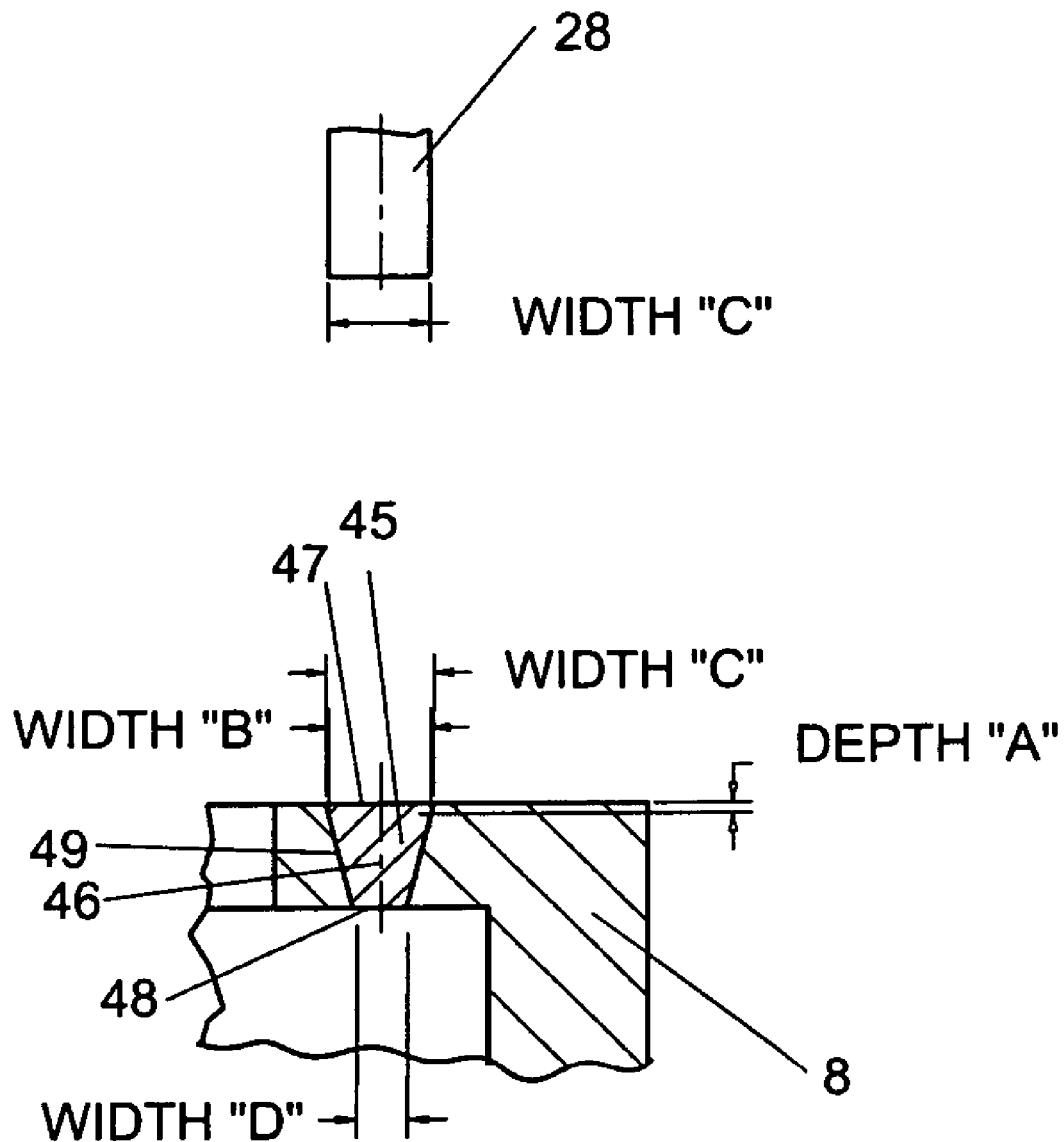
FIG. 6 illustrates a tapered plug according to the third exemplary embodiment of the present invention inserted into a consumable component of a plasma processing system.
Figure 7:
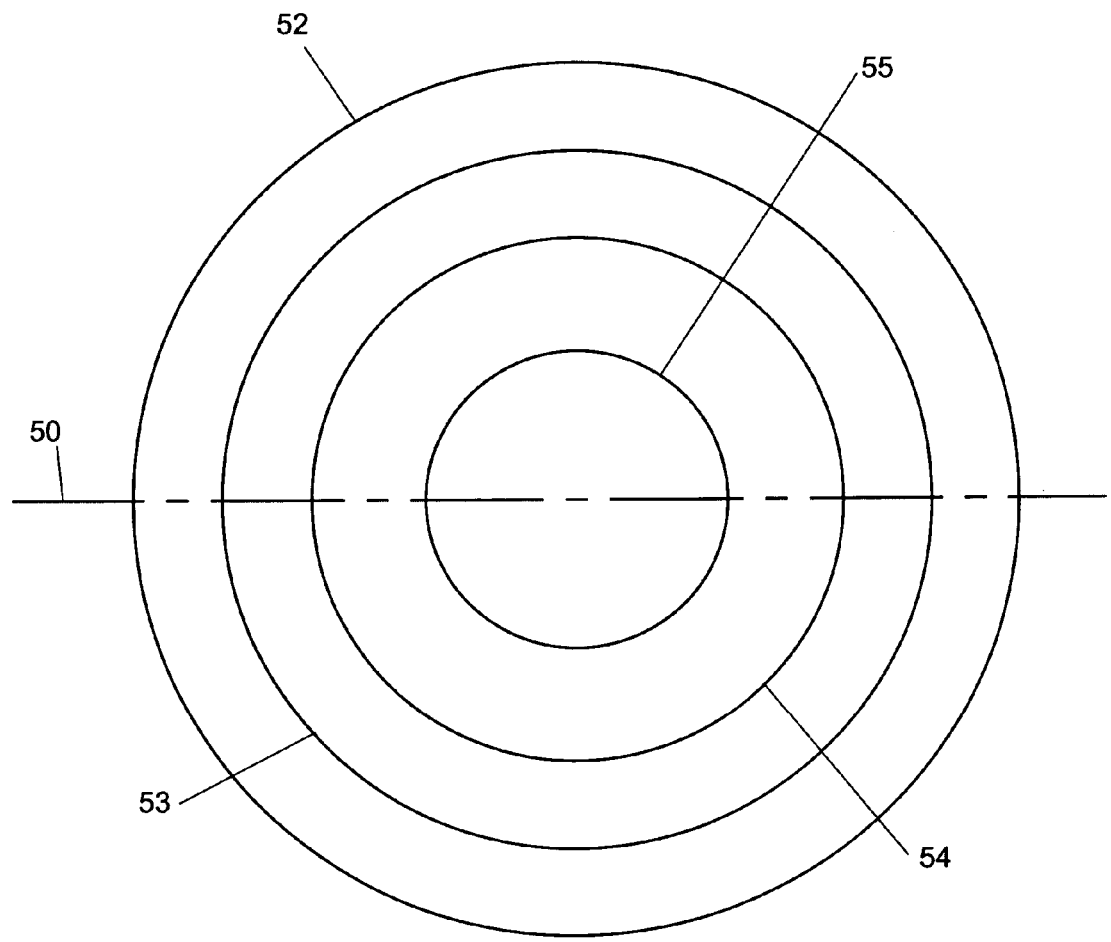
FIG. 7 is a planar view from a perspective above the tapered plug of the third exemplary embodiment inserted into a consumable component illustrated in FIG. 6.

A third exemplary embodiment of a tapered plug is shown in FIGS. 6 and 7. Tapered plug 45 has a first axis 50, a second axis 46 orthogonal to first axis 50, a top portion 47 having a width B along the first axis 50, a bottom portion 48 having a width D along the first axis 50, and sidewalls 49 joining the top portion 47 and bottom portion 48 of the tapered plug 45. As shown in the third exemplary embodiment of FIG. 6, initially, the width of the top portion 47 of the tapered plug 45 is width B, whereas after tapered plug erodes and the top portion 47 of the tapered plug is located at a depth A, the width of the top portion 47 of the tapered plug 45 is width C. In other words, as tapered plug 45 erodes due to exposure to the processing environment the width of the top portion 47 of the tapered plug decreases.

Figure 8:
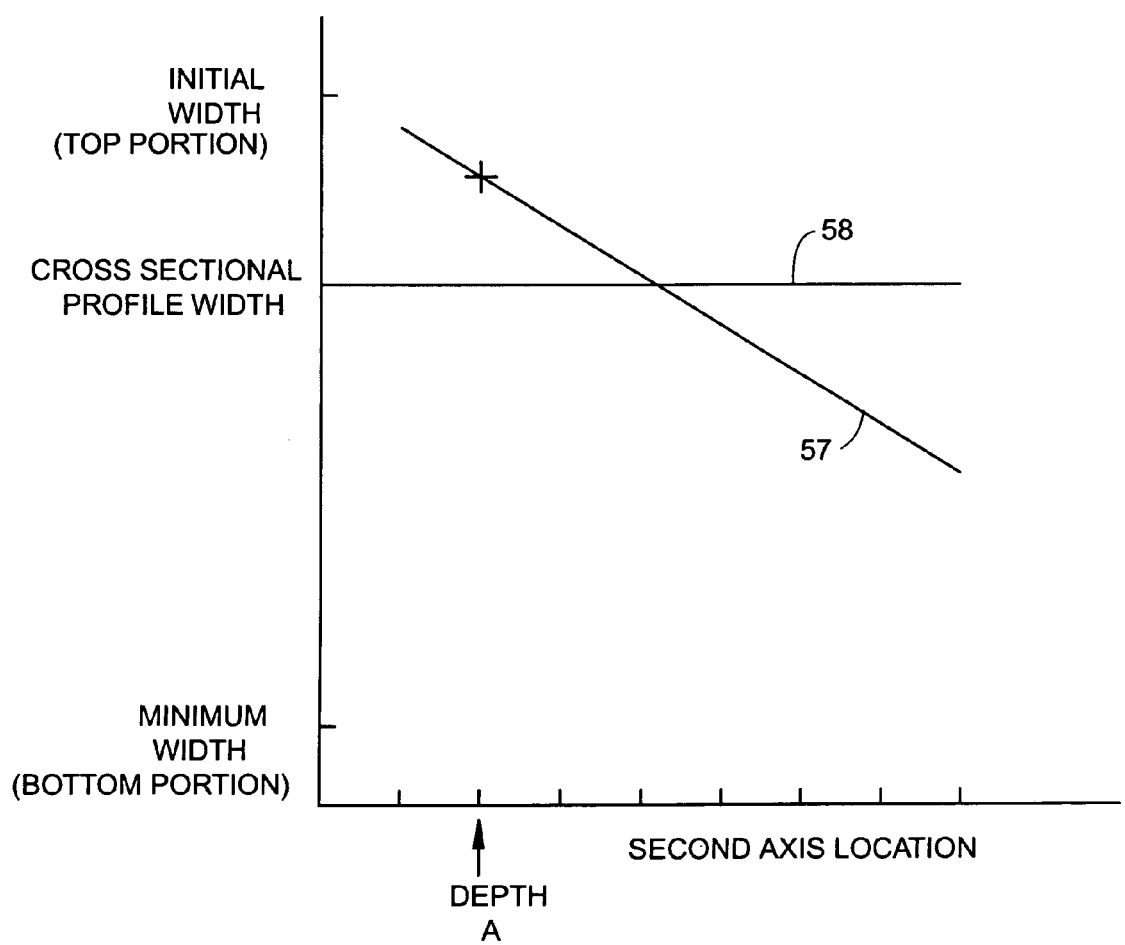
FIG. 8 is a graph illustrating the change in the width of the top portion of the tapered plug of the third exemplary embodiment as the tapered plug erodes or degrades due to exposure to the processing environment.

FIG. 7 is a planar view from a perspective above the tapered plug 45 illustrated in FIG. 6. FIG. 7 illustrates the variation in the width of the cross sectional profile of the tapered plug 45 at different locations along the second axis 46. Line 52 illustrates the width of the cross sectional profile of the tapered plug 45 before erosion or degradation. Line 53 illustrates the width of the cross sectional profile of the tapered plug 45 at a depth A. Line 54 illustrates the width of the cross sectional profile of the tapered plug 45 at a critical depth. Lastly, line 55 illustrates the width of the cross sectional profile of the bottom portion 48 of the tapered plug 45. As shown in FIG. 8, the width of the cross sectional profile that is substantially parallel to the top portion 47 and bottom portion 48 varies according to the location where the cross sectional profile intersects the second axis 46 of the tapered plug 45.

FIG. 8 is a graph illustrating the change in the width of the top portion 47 of the tapered plug 45 as the tapered plug erodes or degrades due to exposure to the processing environment. In FIG. 8, the abscissa represents locations along the second axis 46. The ordinate represents the width of the cross sectional profile of the plug ranging from the minimum width which is equal to the width of the bottom portion 48 to the initial width of the top portion 47 of the tapered plug 45 before erosion. Line 57 on the graph represents the width of the top portion 47 of the tapered plug 45 as the plug erodes due to exposure to the processing environment. While the line 57 has an arbitrary slope, in a preferred embodiment, the tapered plug is designed such that the line 57 approaches horizontal to the greatest extent practical. Having such a steep taper allows a very small erosion depth to result in a large change in diameter that can be easily noticed.

Figure 9:
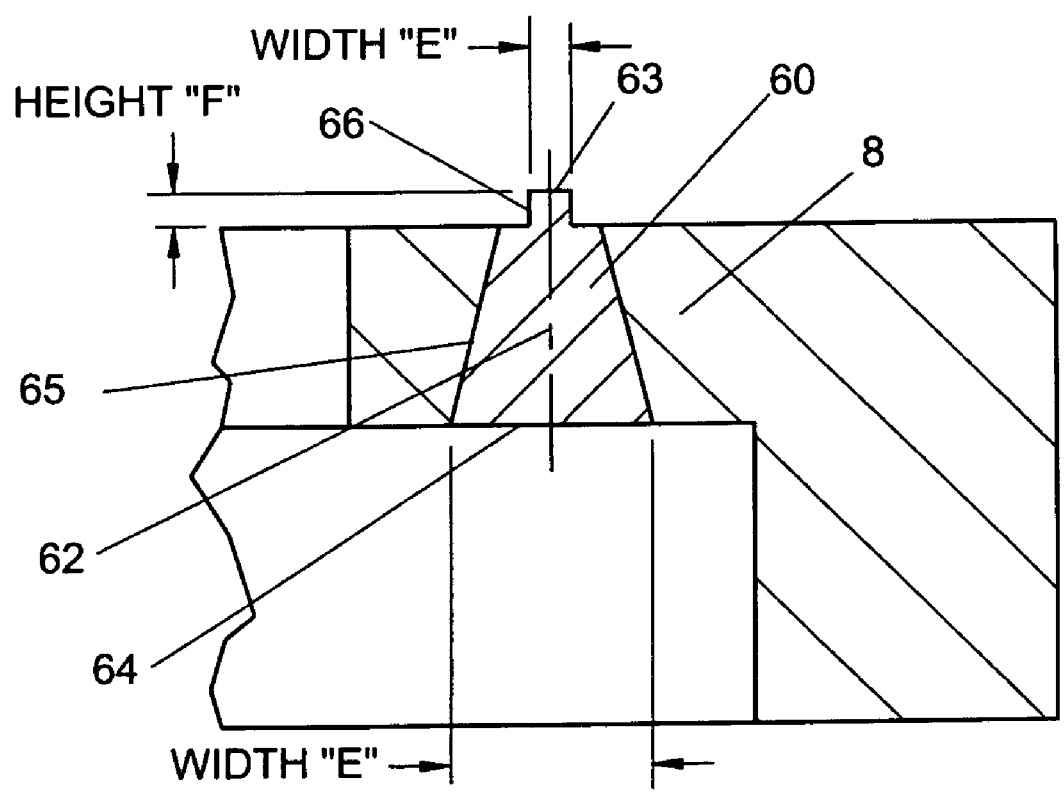
FIG. 9 illustrates a tapered plug according to the fourth exemplary embodiment of the present invention inserted into a consumable component of a plasma processing system.

Horizontal line 58 represents a critical width of the cross sectional profile of the tapered plug 45 that is indicative of when the consumable component in which tapered plug 45 is inserted into or placed in close proximity should be replaced. Thus, in this third exemplary embodiment once the width of the top portion 47 of the tapered plug 45 is equal to or less than the critical width of the cross sectional profile, service action is required by the user (i.e. the consumable component should be replaced, cleaned, or the continued erosion of the consumable component should be more closely monitored). The critical width is a width set by the user and will be discussed in detail later with regard to FIG. 12. A fourth exemplary embodiment of the present invention is illustrated in FIG. 9. Similar to the first exemplary embodiment, tapered plug 60 has a first axis (not shown) similar to the first axis of the first exemplary embodiment that is orthogonal to the second axis 62. The tapered plug 60 also includes a top portion 63 having a width C along the first axis, a bottom portion 64 having a width D along the first axis, and sidewalls 65 joining the top portion 63 and bottom portion 64 of tapered plug 60. However, in the fourth exemplary embodiment the tapered plug 60 includes an extension portion 66 having a width E and a height F. It is noted that the extension portion can have a cross sectional profile that is the same shape (i.e. circular or non-circular) as top portion 63 and bottom portion 64 of the tapered plug. Alternatively, the cross sectional profile may have a different shape than the top portion 63 and bottom portion 64 of the tapered plug 60. Further, as shown in FIG. 9, when the tapered plug 60 is inserted into shield ring 8, the extension portion 66 of the tapered plug 60 extends above the upper surface of shield ring 8. Thus, service action is indicated to the user once the extension portion 66 is completely eroded. The service action may include replacing the consumable component or more closely monitoring further erosion of the consumable component.

Figure 10:
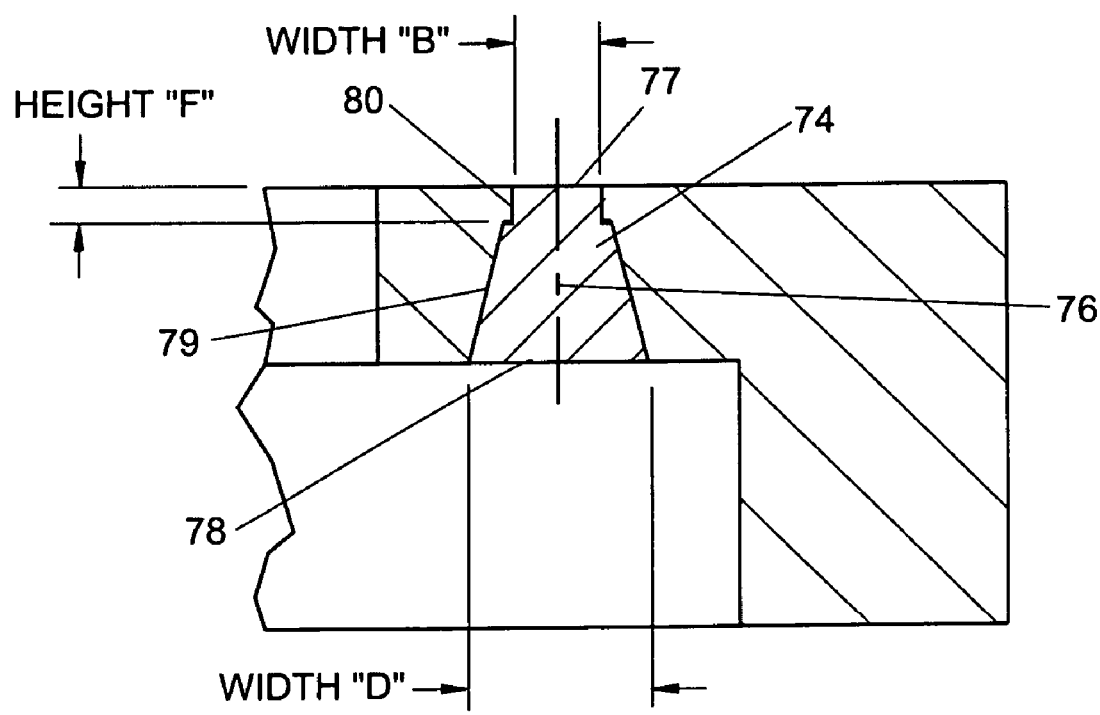
FIG. 10 illustrates a tapered plug according to the fifth exemplary embodiment of the present invention inserted into a consumable component of a plasma processing system.

A fifth exemplary embodiment of the present invention is illustrated in FIG. 10. Similar to the fourth exemplary embodiment, the body of tapered plug 74 has a first axis (not shown and a second axis 76 that is orthogonal to the first axis. The tapered plug 74 includes a top portion 77 having a width B along the first axis, a bottom portion 78 having a width D along the first axis, and sidewalls 79 joining the top portion 77 and bottom portion 78 of tapered plug 74 in the general direction of the second axis 76. Further, the fifth embodiment also includes an extension portion 80 with a width B and a height F. As shown in FIG. 10, in the fifth embodiment the cross sectional width of the extension portion 80 of the tapered plug does not vary. Thus, the width of the top portion 77 of the tapered plug 74 does not vary until the extension portion 80 of the tapered plug 74 is completely eroded due to exposure to the processing environment. Also, the configuration of FIG. 10 provides a sudden and relatively large change in the width that could clearly indicate to the user that an appropriate action needs to be taken. The appropriate action could be to replace the consumable component, clean the consumable component, or more closely monitor further erosion of the consumable component.

Figure 11:
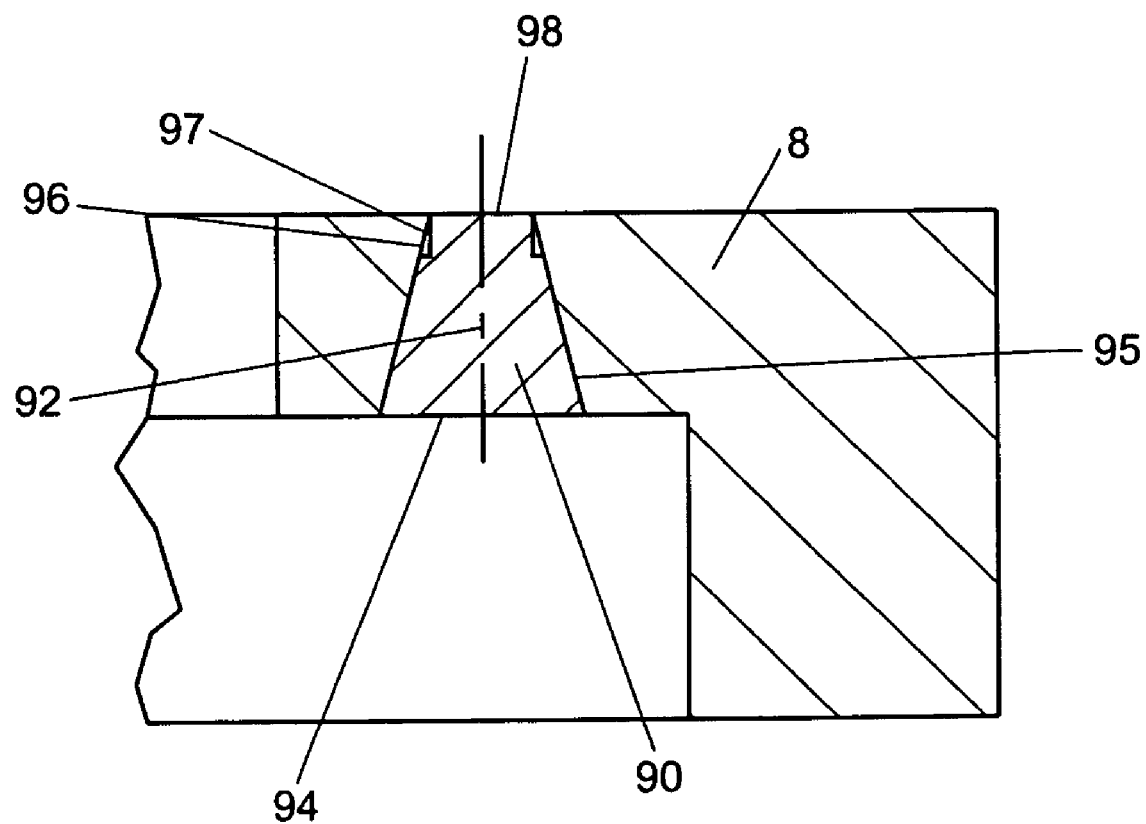
FIG. 11 illustrates a tapered plug according to the sixth exemplary embodiment of the present invention inserted into a consumable component of a plasma processing system.

A sixth exemplary embodiment of the present invention is illustrated in FIG. 11. Similar to the fourth exemplary embodiment, the tapered plug 90 has a first axis (not shown) and a second axis 92 orthogonal to first axis. The body of the tapered plug 90 also includes a top portion 93 having a width along the first axis, a bottom portion 94 having a width along the first axis, and sidewalls 95 joining the top portion 93 and bottom portion 94 of the tapered plug 90 in the general direction of the second axis 92. Further, the sixth embodiment also includes an extension portion 97. As shown in FIG. 11, in the sixth embodiment the cross sectional width of the extension portion 97 of the tapered plug does not vary. Further, in the sixth embodiment, when the tapered plug 90 is inserted into shield ring 8, the top portion 98 of the tapered plug 90 is substantially flush with the upper surface of shield ring 8. However, in the sixth embodiment an annular area 96 is formed between the extension portion 97 and shield ring 8. Thus, as the top portion 98 of the tapered plug 90 erodes the annular area 96 increases until the extension portion 97 completely erodes. Once the extension portion 97 is completely eroded the annular area 96 is eliminated thereby indicating service action for the consumable component should be taken, or that further erosion must be closely monitored.

Figure 12:
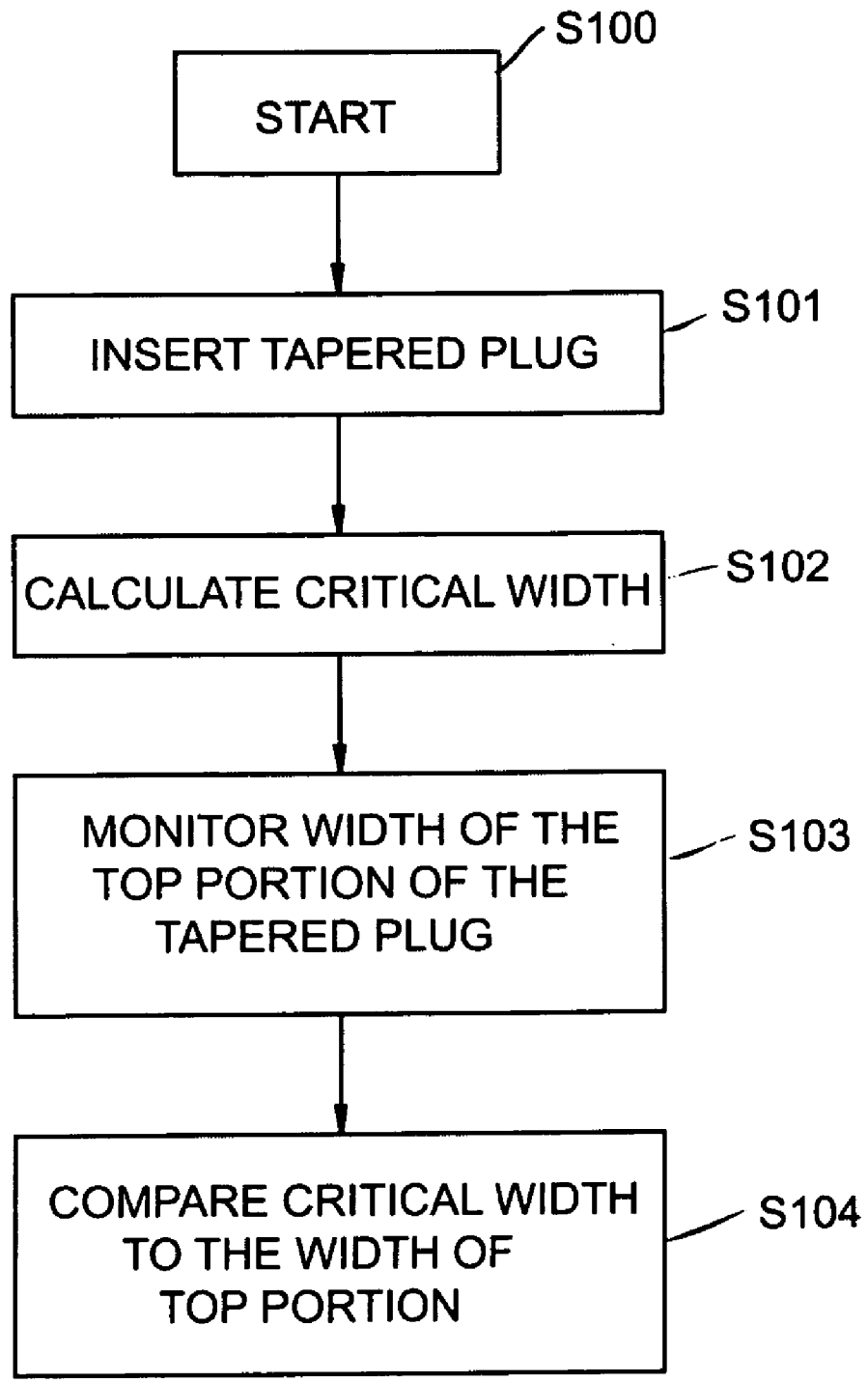
FIG. 12 is a flow chart illustrating an exemplary method for monitoring the condition of a consumable component using the tapered plugs of the first, second, third, fourth, fifth, and sixth exemplary embodiments of the present invention.

FIG. 12 illustrates one exemplary method for monitoring a condition of a consumable component in a substrate processing system including steps S100, S101, S102, S103, and S104. The method includes inserting at least one tapered plug into a consumable component that is to be monitored S101. The tapered plug can be inserted during manufacturing or retrofitted into a preexisting consumable component with or without the adapter of the second exemplary embodiment of the present invention.

The method also includes calculating a critical width S101 that corresponds to a critical depth of erosion or degradation. Examples of critical depths are illustrated by horizontal lines 37 and 58 in FIGS. 4 and 8, respectively. The critical width is determined based on variety of factors including, but not limited to, the material composition of the consumable component and the tapered plug inserted therein, the process the tapered plug and consumable component will be exposed to during processing, and the shape of the tapered plug and consumable component. Calculating the critical width will also vary depending on how the critical width will be used to determine the condition of the consumable component. For example, the critical width may be compared to the width of the top portion of a tapered plug, or alternatively could be compared to the width of an annular area that is formed between the consumable component and an extension portion of the tapered plug inserted therein. Further, the critical width may indicate to the user that the consumable component with the tapered plug inserted therein needs to be replaced, or alternatively, could simply indicated that the consumable component containing the tapered plug should be more closely monitored.

The method illustrated in FIG. 12 also includes monitoring the width of the top portion of the tapered plug S103 inserted into the consumable part. As discussed above, the width of the top portion of the tapered plug can be monitored using visual inspection. Specifically, the top width of the top portion of the tapered plug can be visually inspected to determine a condition of the consumable component without breaking the process vacuum and during processing or dry cleaning events for example. Alternatively, monitoring the width of the top portion of the tapered plug may include taking actual measurements using a variety of techniques.

Lastly, the method of FIG. 12 includes comparing the calculated critical width to the width of the top portion of the tapered plug inserted into the consumable component being monitored S104. The critical width can be compared to the width of the top portion of the tapered plug in a variety of manners. For example, the measured value of the width of the top portion of the tapered plug could be numerically compared to the critical width to determine if the critical width is greater to, less than, or equal to the critical width. Alternatively, a user could place a gauge pin with a width equal to the critical width on the top of the tapered plug and determine whether or not the tapered plug is completely covered by the gauge pin. The above two examples for comparing the width of the top portion of the tapered plug to the critical width determined in S102 are simply illustrative of the variety of techniques that could be used for the comparison and are not intended to be limiting. The result of the comparison in S104 indicates to the user that an appropriate action should be taken, such as replacing the consumable component or more closely monitoring the consumable component.

The method illustrated in FIG. 12 of using a tapered plug that is configured to be inserted into a consumable component for determining particular feature sizes and/or tolerances of the consumable component as described above can provide the ability to quickly determine the condition of a consumable component without the use of time-consuming metrology techniques that may require the consumable component to be removed from the plasma processing system. Therefore, the cost of disassembly and subsequent reassembly of the plasma processing system which results in down-time can be avoided. Further, the measurement of the tapered plug can be made in the clean room environment (or anywhere else) without removal to a metrology environment. Finally, the same tapered plug, or measurement assembly can be used in multiple consumable components (i.e. different consumable components in the same system or different consumable components in different systems).

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

The invention claimed is:

1. A method for monitoring a condition of a consumable component in a substrate processing system, comprising:
    inserting at least one tapered plug into at least one consumable component, said tapered plug including:
        a first axis;
        a second axis intersecting said first axis;
        a top portion having a first width along said first axis;
        a bottom portion having a second width along said first axis; and
        at least one sidewall joining said top portion and said bottom portion such that a cross sectional profile of said tapered plug that is substantially parallel to said top and bottom portions and has a cross sectional width that varies according to a location where said cross sectional profile intersects said second axis,
    wherein said at least one tapered plug is inserted into said at least one consumable component such that said top portion is exposed to a processing environment of a plasma processing system
    calculating a critical width of each of said at least one tapered plug inserted into said at least one consumable component;
    monitoring said first width of said top portion of each of said at least one tapered plug inserted into said at least one consumable component; and
    comparing said critical width to said first width.

2. The method according to claim 1, wherein said inserting includes retrofitting said at least one tapered plug into at least one preexisting consumable component.

3. The method according to claim 1, wherein said monitoring includes visually inspecting said first width through a viewing window.

4. The method according to claim 1, wherein said monitoring includes visually inspecting said first width during at least one of plasma processing and dry cleaning operations.

5. The method according to claim 1, wherein said monitoring includes visually inspecting said first width without compromising pressure constraints of said plasma processing system.

6. The method according to claim 1, wherein said monitoring includes measuring said first width.

7. The method according to claim 1, wherein said monitoring includes measuring said first width during at least one of plasma processing and dry cleaning operations.

8. The method according to claim 1, wherein said comparing includes determining if said critical width is equal to or less than said first width.

9. The method according to claim 1, wherein said comparing includes determining if said critical width is equal to or greater than said first width.

10. The method according to claim 1, wherein said comparing includes utilizing a gauge pin having a size equal to said critical width.

11. The method according to claim 1 further comprising: observing an annular area between said top portion and said at least one consumable component.

12. The method according to claim 11, wherein said observing includes visually inspecting said annular area through a viewing window.

13. The method according to claim 11, wherein said observing includes visually inspecting said annular area during at least one of plasma processing and dry cleaning operations.

14. The method according to claim 11, wherein said observing includes visually inspecting said annular area without compromising pressure constraints of said plasma processing system.

15. The method according to claim 11, wherein said observing includes measuring a width of said annular area.

16. The method according to claim 11, wherein said comparing includes determining if said critical width is equal to or less than said width of said annular area.

17. The method according to claim 11, wherein said comparing includes determining if said critical width is equal to or greater than said width of said annular area.

18. The method according to claim 11, wherein said critical width of said at least one tapered plug correlates to a predetermined critical consumption value of said at least one consumable component.

* * * * *